United States Patent [19]

Masters

[11] 4,455,682

[45] Jun. 19, 1984

[54] SUPERREGENERATIVE RADIO RECEIVER

[75] Inventor: David A. Masters, Norwalk, Ohio

[73] Assignee: Imperial Clevite Inc., Rolling Meadows, Ill.

[21] Appl. No.: 365,819

[22] Filed: Apr. 5, 1982

[51] Int. Cl.³ .................. H04B 1/08; H04B 1/10
[52] U.S. Cl. ............................. 455/300; 343/702; 455/269; 455/336; 455/351
[58] Field of Search ............ 455/95, 128, 300, 347, 455/351, 90, 336, 269; 343/702, 872, 873

[56] References Cited

U.S. PATENT DOCUMENTS

| | | |
|---|---|---|
| 2,558,339 | 6/1951 | Cohen et al. |
| 2,924,705 | 2/1960 | Jones .................... 455/300 |
| 2,941,161 | 6/1960 | Scantlin ................. 455/351 |
| 2,950,479 | 8/1960 | Pan ...................... 343/702 |
| 3,766,563 | 10/1973 | Sauer et al. ............ 343/713 |
| 4,004,228 | 1/1977 | Mullett ................... 455/95 |

Primary Examiner—Marc E. Bookbinder
Attorney, Agent, or Firm—Russell E. Baumann

[57] ABSTRACT

A superregenerative type radio receiver is provided that is particularly adapted for avoiding frequency shift of the receiver from a preselected tuned frequency regardless of installation environment for the receiver. The receiver comprises a superregenerative radio circuit and an associated antenna mounted on a circuit board and received in a container including a wall portion reflective to radio transmissions. The radio circuit is disposed to the wall portion to shroud the radio circuit whereby the radio receiver is adapted to be installed near metallic items and maintain tuned frequency stability.

3 Claims, 6 Drawing Figures

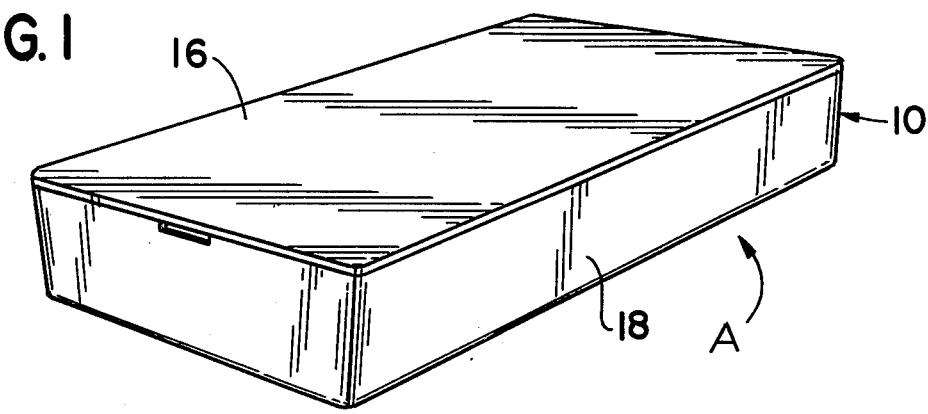
FIG. 1
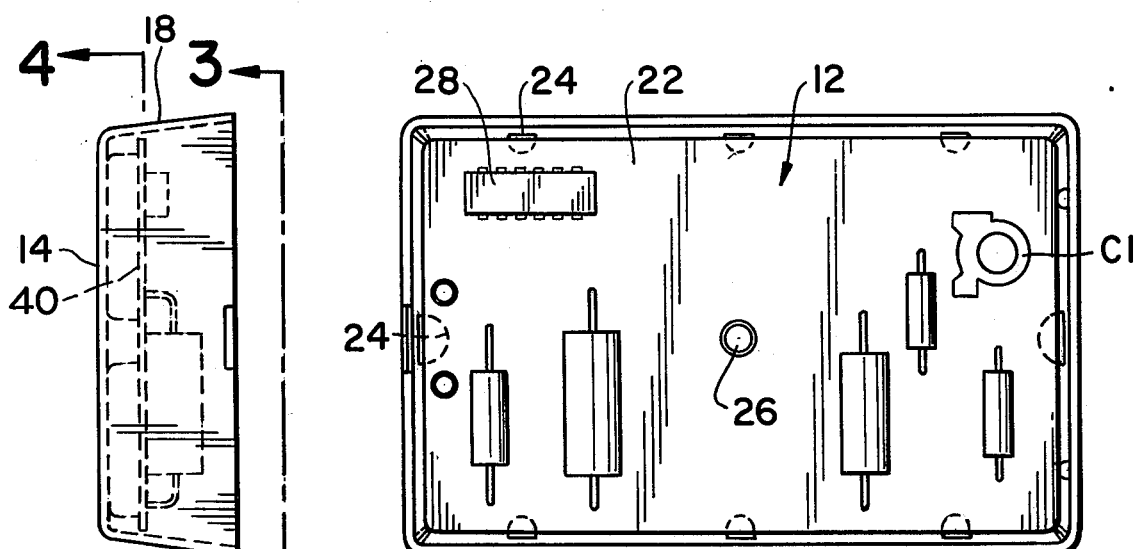
FIG. 2
FIG. 3
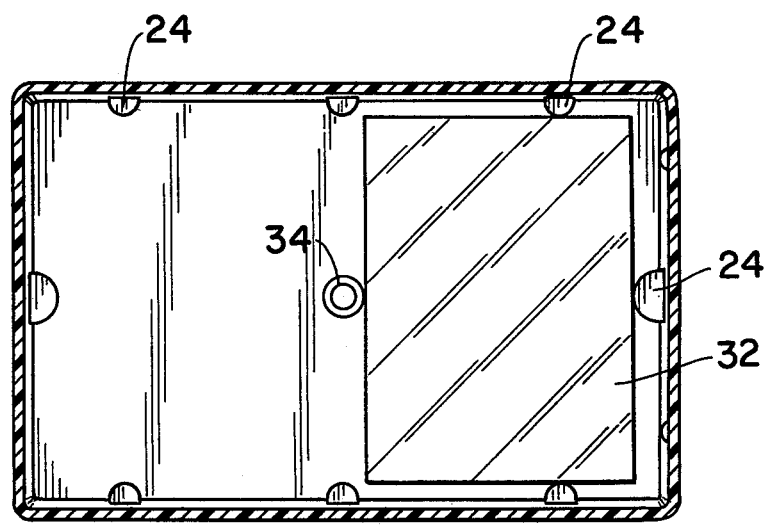
FIG. 4

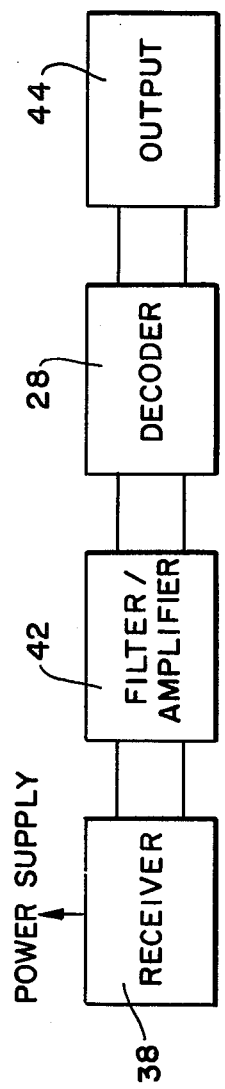
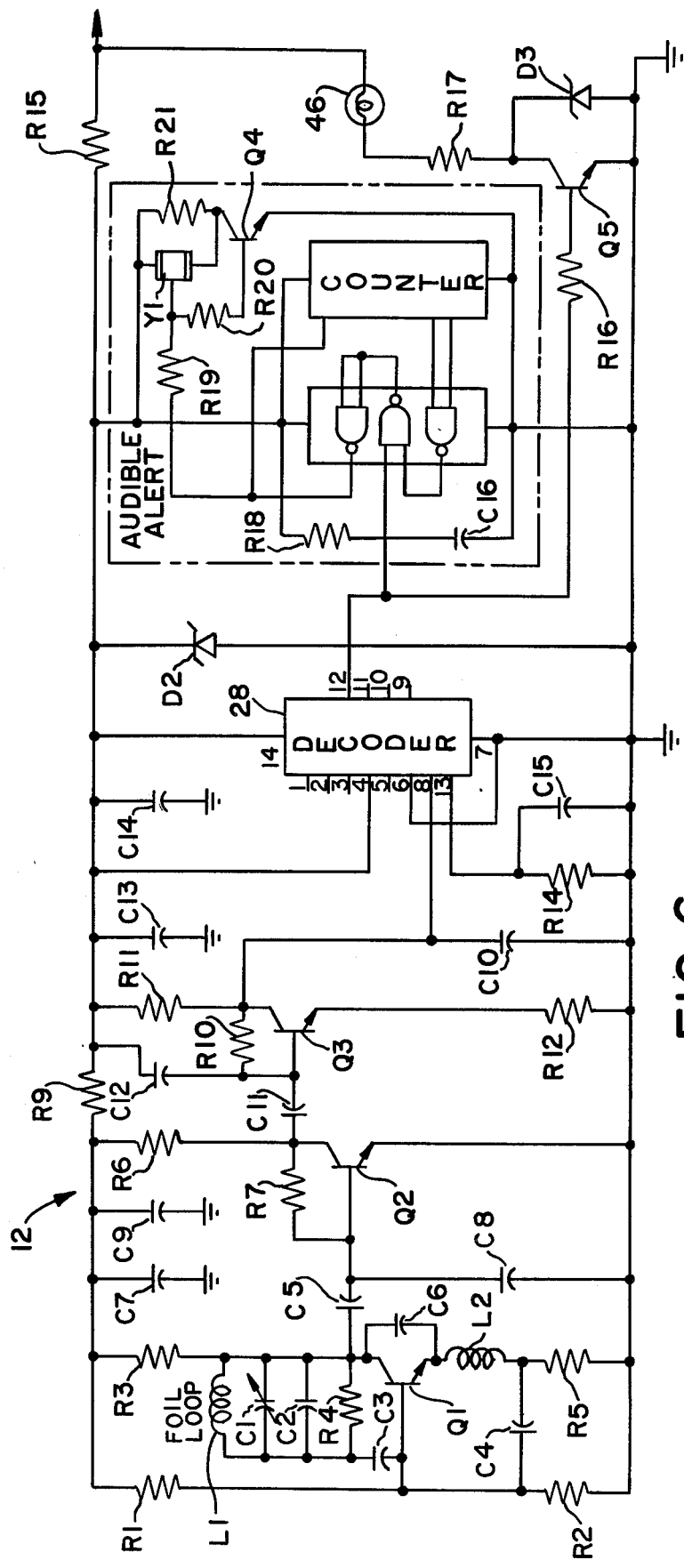
FIG. 5
FIG. 6

SUPERREGENERATIVE RADIO RECEIVER

BACKGROUND OF THE INVENTION

This invention pertains to the art of radio devices and particularly to supperregenerative type radio devices.

The invention is applicable to a container for a super-regenerative type radio receiver for receiving high frequency transmissions and, more particularly, to a superregenerative type radio receiver to be used in an environment, such as an automobile chassis, including nearby metallic objects. Such a receiver may be advantageously employed in conjunction with a low tire warning system as is disclosed in U.S. Pat. No. 4,237,728. However, it will be appreciated by those skilled in the art that the invention can be readily adapted for use in other environments as, for example, where similar radio devices are employed in other types of areas.

Superregenerative type radio receivers are advantageously employed in situations involving high frequency, low power transmission of radio signals, such as may be typically used in an automatic garage door opener. Most manufacturers of superregenerative receivers are especially desirous of high volume production at low cost. Typically, the entire radio receiver circuit is contained on a single circuit board and the antenna therefore comprises a printed circuit trace on the circuit board. In addition, inductors for the circuit may similarly comprise mere wire loop traces upon the circuit board.

The various forms and types of superregenerative radio receivers and containers therefore that have heretofore been suggested and employed in industry have met with varying degrees of success. It has been found that the defects present in most prior superregenerative type radio receivers are such that the devices themselves are of limited economic and practical value.

Superregenerative radio receivers suffer from the problem of being inherently unstable and inclined towards frequency shift especially when the receiver is brought into the vicinity of nearby metallic objects or objects that are capable of exerting a capacitive effect upon the circuit elements. Such effects are primarily exerted upon the circuit elements such as unshielded capacitors and inductors which may typically merely comprise wire loop traces. In addition, reflections of transmitted radio waves to a superregenerative receiver antenna, when reflected to the antenna out-of-phase from the original transmission can hamper receiver operation.

Numerous of ideas have been suggested to force frequency stability in superregenerative receivers. Many of such ideas pertain to circuit add-ons which tend to stabilize free air frequency, but fail to maintain the constant tuned frequency when near radio capacitive objects or radio wave reflective surfaces. Other methods of stabilization include encasing the entire receiver in a metal chassis with an external antenna; however, this method is still prone to the disadvantages of having out-of-phase reflections from metallic surfaces near the protruding antenna. In addition, the circuit add-ons and metal chassis containers are relatively high cost items in comparison to the receiver circuit itself.

The present invention contemplates a new and improved superregenerative type receiver which overcomes the bulk of the above referred to problems and others to provide a superregenerative receiver which is simple in design, includes a printed circuit antenna on the circuitry board, avoids costly frequency stabilizing add-ons, provides in-phase gain of reflected transmissions to the circuit antenna and provides a high degree of frequency stability in a receiver regardless of the installation environment of the receiver.

SUMMARY OF THE INVENTION

In accordance with the present invention, there is provided a container for a radio circuit and an associated antenna comprising a housing having a first wall portion transmissive to radio signals and a second wall portion generally non-transmissive to radio signals. The radio circuit includes radio frequency circuitry which is spaced more closely to the second wall portion than the first wall portion to shroud the radio circuitry whereby the container inhibits frequency shift of the radio circuit.

In accordance with another aspect of the present invention the second wall portion is disposed to the antenna to provide directional in-phase gain of transmitted radio signals to the radio circuit for signals transmitted normal the plane of the second wall portion.

In accordance with a further aspect of the present invention, the housing comprises a base wall, a top wall and an intermediately depending side wall. The second wall portion comprises the base wall in association with a radio wave reflective material.

In accordance with a more limited aspect of the present invention, the radio circuit is included on a printed circuit board wherein the base wall includes spacer member for spacing the printed circuit board from the radio wave reflective material.

In accordance with the present invention there is provided a superregenerative type radio receiver comprising a superregenerative radio circuit and antenna mounted on a circuit board and received in a container. The container includes a wall portion reflective to radio transmissions. The radio circuit is disposed to the wall portion to shroud the radio circuit whereby the radio receiver is adapted to be installed contiguous to metallic items and maintain preselected tuned frequency stability.

One benefit obtained by use of the present invention is a superregenerative type radio receiver which has frequency stability regardless of installation environment and particularly in an installation environment including metallic objects.

Another benefit obtained from the present invention is a superregenerative radio receiver which is economical to manufacture, avoids costly circuit add-ons to maintain frequency stability and includes a circuit trace antenna included on the circuit board.

Other benefits and advantages for the subject new receiver will become apparent to those skilled in the art upon a reading and understanding of the specification.

BRIEF DESCRIPTION OF THE DRAWINGS

The invention may take physical form in certain parts and arrangements of parts, the preferred embodiment of which will be described in detail in the specification and illustrated in the accompanying drawings which form a part hereof and wherein:

FIG. 1 is a perspective view of a receiver formed in accordance with the present invention;

FIG. 2 is an end view of the receiver rotated 90 degrees from the portion shown in FIG. 1 and with a contained circuit board illustrated in phantom;

FIG. 3 is a plan view taken along line 3—3 of FIG. 2;

FIG. 4 is a cross-sectional view taken along line 4—4 of FIG. 2;

FIG. 5 is a block diagram of the circuit employed in the receiver; and,

FIG. 6 is a schematic diagram of the circuit employed in the receiver.

DETAILED DESCRIPTION OF THE PREFERRED EMBODIMENT

Referring now to the drawings wherein the showings are for purposes of illustrating the preferred embodiment of the invention only and not for purposes of limiting same, the Figures show a radio receiver A comprising a housing or container 10 in which a superregenerative type radio circuit 12 is received.

More specifically and with reference to FIGS. 1 and 2, container 10 is preferably constructed of a durable plastic material to provide design flexibility and low cost of production while protecting the radio circuit 12 in the severe environment of an automobile chassis. Container 10 is configured to efficiently receive both the radio circuit 12 and the associated antenna for the radio circuit. Since the antenna is wholly included in the container 10, the container includes a first wall portion transmissive to radio signals to allow reception of transmitted signals by the antenna. The container 10 comprises a base wall 14, a top wall 16 and an intermediate side wall 18 interconnecting top wall 16 and base wall 14. Preferably side wall 18 depends from base wall 14 to define a cupped container area for receiving the radio circuit 12. Top wall 16 preferably comprises a selectively disassociable lid which may be fastened to the base and side walls with conventional fastening means such as screws and nuts and bolts or by other conventional means such as ultrasonic welding.

With reference to FIG. 3 radio circuit 12 comprises a printed circuit board 22 upon which is conventionally received the radio circuit elements. The radio circuit 12 comprises a conventional superregenerative radio circuit and includes a specified radio signal decoder 28 for recognizing the proper signal from an associated transmitter (not shown) and a variable capacitor C1 for tuning the frequency of receiver A to the proper reception frequency. Board 22 is positioned on spacer members or bosses 24 of container 10. A threaded fastener 26 secures the circuit board 22 to the container 10 such that board 22 is precisely positioned relative to base wall 14 by the spacer members 24.

With reference to FIG. 4, base wall 14 includes a second wall portion 32 generally non-transmissive to radio signals. Non-transmissive wall portion 32 may comprise a metallic foil tape adhesively mounted to the inner surface of the base wall 14 or metallic paint painted upon the inner surface of the base wall 14. Alternatively the entire base wall 14 and side wall 18 can be made of a non-transmissive plastic with the lid 16 made of a transmissive material. Non-transmissive wall portion 32 operates to shroud radio frequency circuitry of radio circuit 12 whereby the container inhibits frequency shift to maintain tuned frequency stability of the radio circuit when the receiver A is installed near metal objects such as in the chassis of an automobile. The radio frequency circuitry of radio circuit 12, and particularly that portion of the circuitry for defining the tuned frequency, is spaced more closely to the non-transmissive wall portion 32 than the transmissive wall portions of container 10. All portions of container 10 other than non-transmissive wall portion 32 are transmissive wall portions. A threaded bore 34 is included in base wall 14 for receiving fastener 26.

With reference to FIGS. 5 and 6, the radio circuitry of the invention is illustrated. The receiver portion 38 of radio circuit 12 includes the variable capacitor C1 and inductor L1 and is that portion of the circuit to be especially shrouded from nearby metallic objects. Inductor L1 actually comprises a foil loop or trace upon circuit board 22 on the side 40 of the board facing the bottom wall 14 of container 10 (FIG. 2), and typically may comprise a loop having a diameter in the range of 0.2 to 1 in. Inductor L1 also operates as the antenna for the receiver portion 38. Upon exposure of inductor L1 to a variety of environments including nearby metallic objects, the tuned frequency of the receiver may shift from the free-air frequency due to the capacitive effects exerted upon the inductor L1 by the nearby metallic objects. However, it is a particular feature of the invention that inductor L1 is shrouded from the interference of nearby metallic objects by the non-transmissive wall portion 32 of bottom wall 14. Upon tuning of the receiver portion 38 by adjustment of variable capacitor C1 after installation of the radio circuit 12 into housing 10, the invention will not suffer from detrimental frequency shift due to nearby metallic objects regardless of installation environment.

It is another feature of the invention that the spacer members 24 of base wall 14 space the printed circuit board from the radio wave reflective material of the non-transmissive wall portion 32 a distance which provides in-phase gain of transmitted radio signals of a pre-selected tuned frequency to the radio circuit antenna.

The filter/amplifier portion 42 of radio circuit 12 amplifies the received signal for recognition by a decoder 28 which is specified to identify a pre-selected transmission signal. Upon recognition of the signal, an output circuit portion 44 of the circuit is triggered and may include an audible alert including a piezoelectric resonator Y1, or a visual alert including an instrument lamp 46, or both.

In one operating embodiment, the following exemplary components and circuit values were employed in the radio circuit of FIG. 6. These components and values are in no way deemed to be the overall inventive concepts involved.

| R1 | 47K Ohms | C1 | Variable |
|---|---|---|---|
| R2 | 10K Ohms | C2 | 6.8 pF |
| R3 | 22K Ohms | C3 | 100 pF |
| R4 | 3.3K Ohms | C4 | 270 pF |
| R5 | 6.8K Ohms | C5 | 1 µF |
| R7 | 3.3 M Ohms | C6 | 2.2 pF |
| R8 | 27K Ohms | C7 | 270 pF |
| R9 | 3.3K Ohms | C8 | .001 µF |
| R10 | 3.3K Ohms | C9 | 47 µF |
| R11 | 100 M Ohms | C10 | 270 pF |
| R12 | 240 Ohms | C11 | .1 µF |
| R14 | 100K Ohms | C12 | .001 µF |
| R15 | 150 Ohms | C13 | .1 µF |
| R16 | 1.5K Ohms | C14 | 330 µF |
| R17 | 6.8K Ohms | C15 | 47 pF |
| R18 | 1 M Ohms | C16 | .01 µF |
| R19 | 330K. K Ohms | | |
| R20 | 4.7K Ohms | | |

| R21 | 1K Ohms | L2 | 1.5 μH |

The invention has been described with reference to the preferred embodiment. Obviously, modifications and alterations will occur to others upon the reading and understanding of the specification. It is my intention to include all such modifications and alterations insofar as they come within the scope of the appending claims or the equivalents thereof.

Having thus described my invention I now claim:

1. A superregenerative type radio receiver comprising a superregenerative radio circuit and an antenna mounted on a circuit board and received in a container including a base wall portion comprising material reflective to radio transmissions, said radio circuit being disposed to said base wall portion to shroud said radio circuit and being spaced from said base wall portion by a distance defined by a plurality of spacer members interposed between said circuit board and said wall portion and wherein said base wall portion reflects radio transmissions to said antenna to provide additive in-phase gain at said antenna for a pre-selected tuned frequency, whereby said radio receiver is adapted to be installed contiguous to metallic items and maintain tuned frequency stability.

2. The container as described in claim 1 wherein said radio wave reflective material comprises metallic paint painted upon an inner surface of said base wall.

3. The radio receiver as claimed in claim 1 wherein said wall portion includes a metallic foil tape adhesively attached to an inner wall of said receiver.

* * * * *